US012793937B2

(12) United States Patent
Jelinek et al.

(10) Patent No.: US 12,793,937 B2
(45) Date of Patent: Nov. 10, 2026

(54) ION BEAM CURRENT MEASUREMENT DEVICE AND ION BEAM IMPLANTATION SYSTEM

(71) Applicant: Infineon Technologies AG, Neubiberg (DE)

(72) Inventors: Moriz Jelinek, Villach (AT); Axel König, Villach (AT); Bernhard Leitl, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 375 days.

(21) Appl. No.: 18/524,043

(22) Filed: Nov. 30, 2023

(65) Prior Publication Data

US 2024/0194444 A1 Jun. 13, 2024

(30) Foreign Application Priority Data

Dec. 12, 2022 (DE) ......................... 102022133030.3

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/24405* (2013.01); *H01J 2237/24528* (2013.01); *H01J 2237/24535* (2013.01); *H01J 2237/31703* (2013.01)

(58) Field of Classification Search
CPC ................. H01J 37/3171; H01J 37/304; H01J 2237/24405; H01J 2237/24528; H01J 2237/24535; H01J 2237/31703
See application file for complete search history.

(56) References Cited

U.S. PATENT DOCUMENTS

| | | | |
|---|---|---|---|
| 2009/0302214 A1 | 12/2009 | Igo et al. | |
| 2011/0073777 A1 | 3/2011 | Pandolfi | |
| 2013/0256566 A1 | 10/2013 | Kariya et al. | |
| 2021/0134559 A1* | 5/2021 | Potkins | H01J 37/3171 |

* cited by examiner

*Primary Examiner* — Georgia Y Epps
*Assistant Examiner* — Hanway Chang
(74) *Attorney, Agent, or Firm* — Murphy, Bilak & Homiller, PLLC

(57) ABSTRACT

An ion beam current measurement device includes a first Faraday cup having a first ion beam entrance slit of a first width $W_1$. The first Faraday cup is configured to generate a first current signal. The device further includes a second Faraday cup having a second ion beam entrance slit of a second width $W_2$. The second Faraday cup is configured to generate a second current signal. The slit widths are designed such that $W_2$ is greater than $W_1$.

20 Claims, 3 Drawing Sheets

ION BEAM CURRENT MEASUREMENT DEVICE AND ION BEAM IMPLANTATION SYSTEM

TECHNICAL FIELD

This disclosure relates generally to the field of ion beam current measurement devices, and in particular to ion beam current measurements using faraday cups.

BACKGROUND

Faraday cups are devices for ion beam current measurement. In ion implanters for wafer processing, Faraday cups are used to calibrate the ion beam dose. Implant dose accuracy and reproducibility are major challenges in semiconductor device fabrication. In particular, high repeatability of day-to-day implant dose and high uniformity of the implant dose across wafers are critical and increasingly stringent requirements imposed by future advanced device technologies.

Faraday cups are subjected to Faraday cup slit degradation resulting in ion beam dose measurement errors. Measurement errors may show up as slowly increasing or decreasing dose shift trends or as sudden changes in the measured dose. It is important to accurately distinguish between corrupted measurement results due to slit degradation of the Faraday cup and true measurement results caused by a real change of the ion beam implant dose.

SUMMARY

According to an aspect of the disclosure, an ion beam current measurement device includes a first Faraday cup having a first ion beam entrance slit of a first width W1. The first Faraday cup is configured to generate a first current signal. The ion beam current measurement device further includes a second Faraday cup having a second ion beam entrance slit of a second width W2. The second Faraday cup is configured to generate a second current signal. The slit widths are designed such that W2 is greater than W1.

According to another aspect of the disclosure, an ion beam implantation system includes a process chamber. A substrate holder is disposed in the process chamber and configured to hold a substrate to be subjected to ion implantation. An ion beam generator is configured to generate an ion beam for ion implantation into the substrate. The ion beam implantation system further includes an ion beam current measurement device as recited above, disposed adjacent the substrate holder. A slit width change computation module is configured to calculate a time-dependent slit width change indicator based on the first current signal and the second current signal. An implant dose control system is configured to control the implant dose based on the time-dependent slit width change indicator.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

Figure 1:
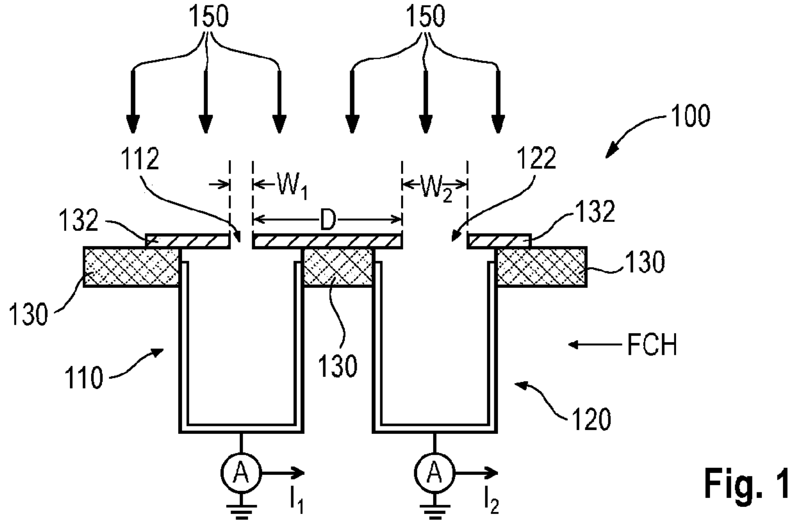
FIG. 1 is a schematic cross-sectional representation of an exemplary ion beam current measurement device.

FIG. 1 illustrates an ion beam current measurement device 100 in a sectional representation. The ion beam current measurement device 100 is of the Faraday design type. The measurement device 100 includes a first Faraday cup 110 and a second Faraday cup 120. The first Faraday cup 110 has a first ion beam entrance slit 112 of a first width W1. The second Faraday cup 120 has a second ion beam entrance slit 122 of a second width W2. Both Faraday cups 110, 120 are configured to independently generate first and second current signals $I_1$ and $I_2$, respectively.

According to the disclosure and for reasons which will be described in more detail further below, the second slit width W2 is greater than the first slit width W1.

FIG. 1 illustrates that the measurement device 100 is subjected to an ion beam illustrated by arrows 150. The ion beam 150 considered herein has a constant implant dose rate across the horizontal direction of FIG. 1, i.e. for the first and second entrance slits 112, 122. That is, it can be assumed that both Faraday cups 110, 120 would basically measure the exact same current $I_1=I_2$ if the slit widths would be the same ($W_1=W_2$). However, since on the contrary $W_2$ is greater than $W_1$, the second current signal $I_2$ is greater than the first current signal $I_1$. More specifically, $W_2/W_1=I_2/I_1$, for example.

A distance D between the first entrance slit 112 and the second entrance slit 122 may, e.g., be equal to or less than D=5 cm or 2 cm or 1 cm or 0.5 cm. In practice, the smaller D1 the better the measurement device 100 ensures that the ion implant dose rate and vacuum conditions are quite similar for both entrance slits 112, 122.

For example, the ratio of slit width $W_2/W_1$ may, e.g., be equal to or greater than 1.5, 2, 3, 4, or 5. The greater $W_2/W_1$ the more sensitive is the measurement device 100 when used to determine slit width degradation effects as considered below.

The measurement device 100 may further include a Faraday cup frame 130. The Faraday cup frame 130 holds the first and second Faraday cups 110, 120 and/or the first and second entrance slits 112, 122 in a fixed positional relationship. For example, the Faraday cup frame 130 may be formed as a common Faraday cup holder. The Faraday cup frame 130 may, e.g., include or be made of an insulating material in order to exclude electrical contact between the first Faraday cup 110 and the second Faraday cup 120. Further, the Faraday cup frame 130 may either be designed as a mounting platform for mounting the first and second entrance slits 112, 122 thereon or the first and second entrance slits 112, 122 may, e.g., be integrally formed in the Faraday cup frame 130.

More specifically, the entrance slits 112, 122 may, e.g., be formed in individual slit plates 132 or in a common slit plate 132, which may, e.g., be held on ground potential. The slit plate (s) 132 may, e.g., be mounted to the Faraday cup frame 130 or may be integral with the Faraday cup frame 130.

The measurement device 100 may be accommodated in a common housing (not shown). The housing may have signal output ports for the first current signal $I_1$ and the second current signal $I_2$ and/or may include circuitry for processing and/or comparing the current signals $I_1$, $I_2$, as will be described in more detail further below.

Each Faraday cup 110, 120 may be individually equipped with electrostatic and/or magnetic suppression means to prevent ions, which have entered the respective cup to escape without being measured and/or to prevent electrons from entering/escaping the Faraday cup. Each Faraday cup 110, 120 is electrically connected separately to enable distinct and/or independent current measurements.

The first and second Faraday cups 110, 120 together with the first and second ion beam entrance slits 112, 122, the (optional) frame 130 and/or slit plates 132 and the (optional) housing as well as appropriate current measurement devices (denoted by A in FIG. 1) for generating the first and second current signals $I_1$ and $I_2$ will also be referred to as Faraday cup hardware FCH of the measurement device 100 in the following.

Figure 2:
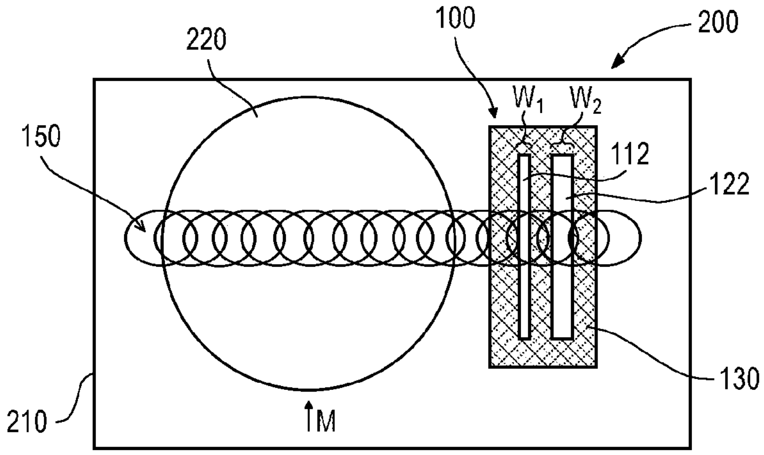
FIG. 2 is a schematic top view of an exemplary dosimetry setup in an ion beam implantation system showing a wafer in process, an ion beam sweeping track, and a dual slit ion beam current measurement device.

FIG. 2 illustrates in an incident ion beam view representation an example of an ion beam implantation system 200 which includes the measurement device 100. The ion beam implantation system 200 may include a process chamber 210. A substrate 220, e.g. a wafer, is subjected to the ion beam 150. Further, the measurement device 100 is also subjected to the ion beam 150.

In the example shown, the ion beam 150 is swept or scanned in a horizontal direction across the substrate 220 and across the measurement device 100. For example, during operation, the ion beam 150 may be scanned over the substrate 220 in process and over the first and second ion beam entrance slits 112, 122 with a sweeping frequency in, e.g., the kHz range. In other words, the substrate 220 and the measurement device 100 may be exposed to a fanned-out ion beam 150. Sweeping the ion beam 150 in a horizontal direction may, e.g., be performed by magnetic or electrostatic deflection.

In other examples the ion beam 150 may be a stationary stripe-shaped beam instead of an ion beam 150 scanned in horizontal direction. In both cases the measurement device 100 is exposed to the same ion beam 150 (i.e. to the same ion beam implant dose rate) as the substrate 220 (or, more generally, to an ion beam implant dose rate which is a known, predetermined ratio of the ion beam implant dose rate to which the substrate 220 is exposed). Hence, the measurement device 100 is capable of measuring a quantity which is indicative of the implant dose (i.e. the number of ions which hit the implantation target per $cm^2$) applied to the substrate 220. Differently stated, the implant dose is a (known) function of the measured quantity.

The distance between the right edge of the substrate 220 and the left edge of the nearest entrance slit (here, e.g., the first entrance slit 122, see FIG. 1) may, e.g., be equal to or less than one or a few centimeters.

In some examples, the measurement device 100 may be operated as a closed loop Faraday measurement device. In this case, the implant dose may be measured, e.g., for each ion beam sweep. The substrate 220 is moved in direction of arrow M, e.g., in a direction perpendicular to the sweeping direction below the ion beam 150. For example, the speed of movement may be controlled as a function of the measured quantity (measurement result), e.g. as a function of any of the current signals $I_1$, $I_2$. For example, if $I_1$ decreases during substrate processing, the implant dose rate is considered to be decreasing. In response the speed of movement of the substrate 220 is slowed down to guarantee that the same implant dose is applied across the entire surface of the substrate 220.

The same process of closed loop control to ensure a uniform implant dose exposure across the substrate 220 may be carried out for a stripe-shaped spatially stationary ion beam 150.

In other examples the measurement device 100 may be used as a calibration Faraday measurement device. Calibration Faraday measurement devices 100 are used for the setup of the ion beam implantation system 200, i.e. without having a substrate 220 in the process chamber. During setup the ion beam 150 is passed over the measurement device 100 for setup and calibration purposes. In this case ion current measurements are also repeatedly performed, but the repetition rate may be much smaller, e.g., in a per substrate (wafer) rate or a per day rate.

Accurate control of any dosimetry system is limited by the fact that all dosimetry related parts and, in particular, the ion beam current measurement device 100 are heavily exposed to either the ion beam 150 itself or the processing station environment. This leads to deterioration of these parts and an associated shift in measurement results, affecting the implant dose accuracy performance of the dosimetry system. As a consequence of the degradation of a Faraday cup entrance slit used for ion beam current measurement, the actual ion dose implanted in the substrate 220 deviates from the target implant dose.

Figure 3A:
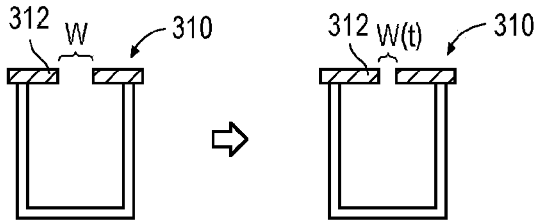
FIGS. 3A and 3B are schematic cross-sectional representations of slit degradation mechanisms that provide under-dose and over-dose measurement results, respectively.
Figure 3B:
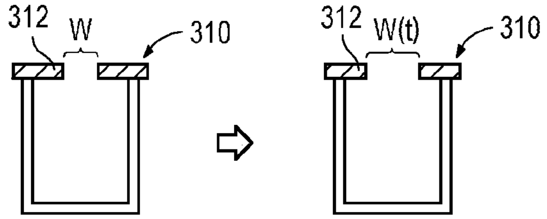

Two possible slit degradation mechanisms are illustrated in FIGS. 3A and 3B. Referring to FIG. 3A, deposition of, e.g., the widely used molecular species $BF_2$ and $BF_3$ and/or related species may narrow the ion beam entrance slit 312 of a Faraday cup 310. On the other hand, referring to FIG. 3B, sputtering effects caused, e.g., by heavier single atomic species such as, e.g., Ar or As may widen the ion beam entrance slit 312. If an ion beam yields more sputtering or deposition effects is dependent on the involved species. As the slit width of the Faraday cup aperture varies with time, the dosimetry of the system is affected accordingly. For example, a variation in the slit width of 0.5% can directly be related to an error in implant dose of 0.5%.

Conventionally, a calibration Faraday cup, which is not as heavily in use as the main Faraday cup, has been implemented to calibrate the main Faraday cup used for dosimetry. However, the use of a calibration Faraday cup operated under different conditions and deteriorating over time adds another uncertainty, and the unknown influence of the species affects the accuracy and reliability of the calibration.

Figure 4:
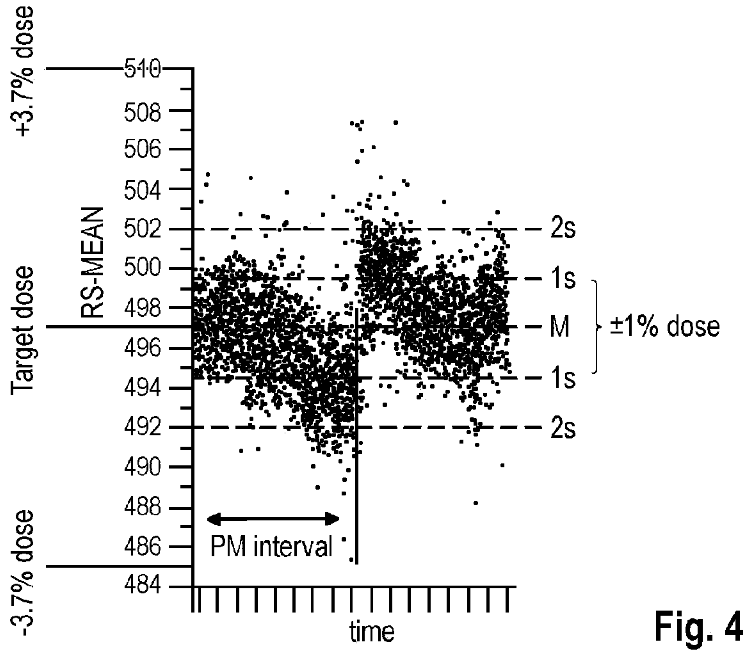
FIG. 4 illustrates a diagram showing sheet resistance measurement results as a function of time obtained by an ion beam implantation system, where the effect of a preventive maintenance procedure shows up as a sudden change in the measurement results.

FIG. 4 illustrates sheet resistance measurement results of implanted Si versus time, obtained on one of the most accurate ion beam implantation systems on the market using a conventional Faraday cup dosimetry system. Apparently, the plotted implant dose (which corresponds to the measured sheet resistance) decreases over time during a so-called preventive maintenance (PM) interval. As described above, this decrease in implant dose can be related to a drift of the dosimetry over time caused by the slit degradation (in this case: slit widening) of the ion beam entrance slit of the Faraday cup used for the measurement. As explained above, slit degradation may also be represented by a narrowing of the slit width. In this case the time dependent trend of the sheet resistance measurement results would yield an increase of the implant dose over time.

The PM intervals are chosen to timely correct or recalibrate the dosimetry system. During PM at least the slit of the Faraday cup is replaced by a new one. The length of a PM interval depends on the operation conditions and the required implant dose accuracy of the ion beam implantation system. Typically, PM has to be carried out on a time scale of weeks or one or several months or (if low accuracy is sufficient) on an annual rate, for example.

The PM procedure shows up in FIG. 4 as a steep and sudden change in the sheet resistance measurement results (corresponding to the implant dose). M denotes the mean value and s denotes the standard deviation of the measured implant dose distribution.

According to the disclosure, an ion beam current measurement device 100 is provided which avoids the increasing or decreasing measurement data trend between PM intervals by actively controlling and/or recalibrating the implant system for changed conditions of the dosimetry system with respect to Faraday cup slit degradation. The frequency of controlling and/or recalibrating of the system can be chosen in wide range. For instance, controlling and/or recalibrating can be done on a high frequency scale, e.g. for any sweep of the ion beam 150 across the substrate 220 and the ion beam current measurement device 100 (see e.g. FIG. 2). In this case the speed of the motion of the substrate (wafer) 220 (or any other quantity effective for implant dose adjustment) may be controlled based on the recalibrated ion beam current measurement results, for example. The ion beam current measurement device 100 may be used as a closed loop Faraday device or as an open loop Faraday device.

In other examples the control and/or recalibration may be performed on a larger time scale, e.g. per wafer or per day, or week, etc. This time scale may, e.g., also apply to a calibration Faraday which is used during interruptions of the ion implant operation.

Figure 5:
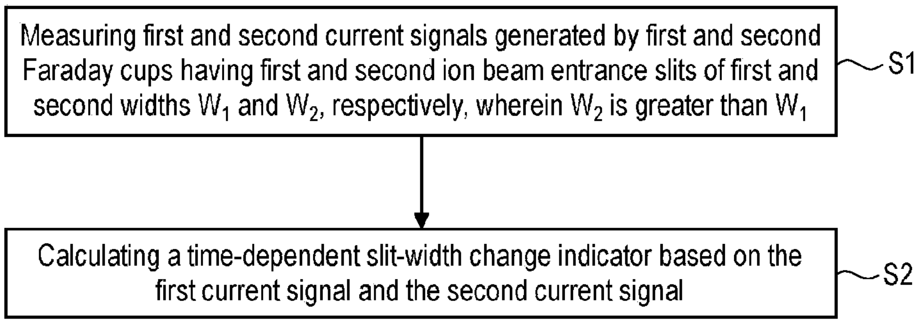
FIG. 5 is a flowchart illustrating exemplary stages of a method of monitoring a process of ion implantation into a substrate.

Referring to FIG. 5, a method of monitoring a process of ion implantation may include, at S1, measuring first and second current signals I1, I2 generated by first and second Faraday cups 110, 120 having first and second ion beam entrance slits 112, 122 of width $W_1$ and $W_2$, respectively. Measurement of the current signals $I_1$, $I_2$ may be done by independent current measurement devices (see FIG. 1).

At S2 a time-dependent slit width change indicator is calculated based on the first current signal I1 and the second current signal I2.

For example, a time-dependent slit width change indicator is calculated based on a ratio of the slit widths $W_1$, $W_2$ and/or a ratio of the first and second current signals $I_1$, $I_2$.

In the following an exemplary way of calculating a time-dependent slit width change indicator y (t) is presented: Exemplary Mathematical Framework:

The (initial) width $W_2$ of the second slit 122 is defined as $W_2=x\cdot W_1$ by the (initial) width $W_1$ of the first slit 112 via a factor x, with x>1 (differently stated, $W_2$ is the width of the wider slit and $W_1$ is the width of the narrower slit—here, only for explanatory reasons, it is assumed that the second slit 122 is the wider slit).

The decrease or increase of the slit width by time is defined by a percentage y(t) of the width of the first slit 121, with $-1<y(t)<1$.

The widths of both slits 112, 122 increase or decrease exactly the same in absolute number.

Using these conditions, the time dependent ratio between the two currents $I_1(t)$, $I_2$ (t) can be expressed by $$\frac{I_1}{I_2}(t) = \frac{W_1 + y(t)\cdot W_1}{W_2 + y(t)\cdot W_1} = \frac{W_1 + y(t)\cdot W_1}{x\cdot W_1 + y(t)\cdot W_1} = \frac{1+y(t)}{x+y(t)} \quad \text{(equation 1)}$$

with $$\frac{I_1}{I_2}(t=0) = \frac{1}{x} \text{ and } y(t=0) = 0$$

A rearrangement of the expressions above yields for the time dependent change in slit width (as expressed, e.g., by the time-dependent slit width change indicator y(t)):

$$y(t) = \frac{\frac{I_1}{I_2}(t)\cdot x - 1}{1 - \frac{I_1}{I_2}(t)} \quad \text{(equation 2)}$$

Since the change of the slit width is directly proportional to the ratio of the currents $I_1(t)/I_2$ (t) and eventually to the implant dose, the implant dose can directly be corrected by y(t).

In other words, the time-dependent slit width change indicator y (t) gives at all times an indicator of the current slit width change as compared to initial conditions (i.e. known slit widths $W_1$, $W_2$). Thus, any error introduced into the dosimetry system by the (unknown) change in slit widths can be corrected at any time.

One possibility of correcting or recalibrating the dosimetry system is to use a corrected current measurement result instead of the actual current measurement result output by the ion beam current measurement device 100 for dosimetry system control. For example, referring, e.g., to $I_1(t)$ as the actual current measurement result, the corrected ion beam current measurement result can be expressed by $$I_1^{corr}(t) = \frac{I_1(t)}{1+y(t)} \quad \text{(equation 3)}$$

Any quantity effective for implant dose adjustment may be controlled based on the corrected (i.e. "true") ion beam measurement result (e.g. $I_1^{corr}(t)$)

instead of the actual (i.e. distorted) ion beam current measurement result (e.g. $I_1(t)$). For example, the speed of the motion of the substrate (wafer) 220 may be controlled based on the corrected ion beam current measurement result.

For example, using equation (2) with the measured currents $I_1$, $I_2$ as an input yielding y(t)=−0.01, the implant dose needs to be recalibrated by −1% to remain unaffected by the slit degradation.

Further, means for computing the corrected ion beam current measurement result are disclosed. These means could be implemented in various different entities. In one example, the means may be implemented in the ion beam current measurement device 100 as such. In this case, the ion beam current measurement device 100 may output, $$\text{e.g., } I_1^{corr}(t)$$

in addition to or instead of the actual ion beam current measurement result (e.g. $I_1(t)$, $I_2(t)$). As will be described in greater detail further below, in other examples, such means could be implemented in external entities such as, e.g., dose adjustment computation module CM2, see FIGS. 8, 9.

It is to be noted that y (t) as expressed by equation (2) is only one example for a time-dependent slit width change indicator, and other mathematical framework could be used to derive other such indicators. For example, y (t) is related by definition to the width $W_1$ of the first slit 112. The indicator could just as well be related to the second width $W_2$ of the second slit 122, for example.

It can be observed from equation (2) yielding y (t) that $I_1/I_2$ decreases if the width $W_2$ of the second slit 122 is increasing and both slits 112, 122 get narrower (as expressed by a negative y(t)). This means that the current $I_2$ measured on the second Faraday cup 120 (i.e. the Faraday cup with the wider second slit 122) is significantly larger than the first current $I_1$ measured on the first Faraday cup 110 with the first slit 112 (the narrower slit). Hence, for the best sensitivity (corresponding to the lowest $I_1/I_2$) the width $W_2$ of the second slit 122 should be as large as possible and/or the width $W_1$ of the first slit 112 should be as small as possible (i.e. the ratio $W_1/W_2$ should be as small as possible).

Figure 6:
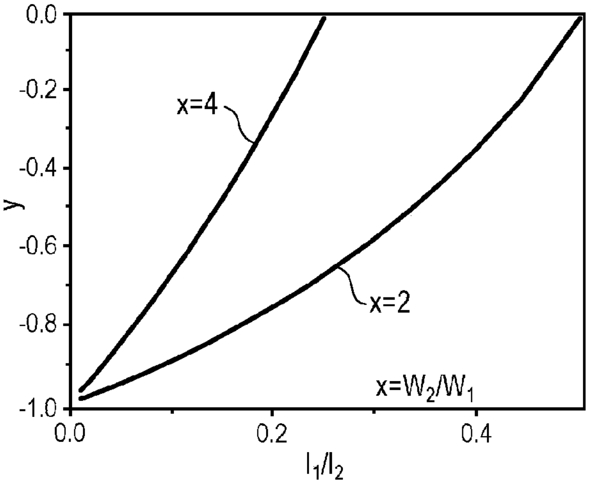
FIG. 6 is a diagram illustrating the behavior of two time-dependent slit width change indicators as a function of a ratio of the first and second current signals for slit width ratios $W_2/W_1=2$ and $W_2/W_1=4$, respectively.

FIG. 6 illustrates the above statement in two dimensions. The behavior of two time-dependent slit width change indicators y for x=4 and x=2, respectively, are shown as a function of a ratio of the first and second current signals $I_1/I_2$. If the second slit 122 is four times as wide as the first slit 112 (i.e. x=4) the curve is significantly steeper as compared to the case when the second slit 122 is just twice as large as the first slit 112 (i.e. x=2). The steeper the curve, the more sensitive is the control or recalibration of the dosimetry system based on the respective time-dependent slit width change indicator y(t).

Figure 7:
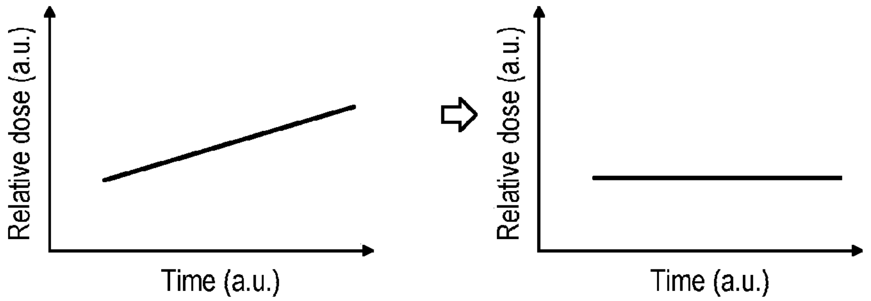
FIG. 7 illustrates diagrams showing simplified relative implant dose trends as a function of time obtained without and through the method of monitoring a process of ion implantation into a substrate in accordance with the disclosure.

FIG. 7 illustrates simplified relative implant dose trends as a function of time (arbitrary units) obtained without (left graph) and through (right graph) the method of monitoring a process of ion implantation and controlling or recalibrating the dosimetry of ion implantation system based on a time-dependent slit width change indicator, e.g. y(t). As mentioned above, the time-dependent slit width change indicator y (t) may be derived by measuring the first and second current ratio $I_1/I_2$ during operation of the ion beam implantation system 200 or, at least, repeatedly during a maintenance interval operation period such as, e.g., a PM cycle.

In FIG. 7 the relative dose (arbitrary units) is the actual implant dose normalized by the target implant dose. As apparent from FIG. 7, the correction or recalibration of the dosimetry system by means of a time-dependent slit width change indicator y (t) allows to avoid the increasing or decreasing dose shift trend of the dosimetry system to achieve 100% target dose by actively controlling/recalibrating, e.g., each wafer process run and/or another operation period and/or the whole PM interval for changed conditions of the dosimetry system during the monitored period with respect to hardware wear-out (e.g. slit degradation). That way, a high repeatability of, e.g., ion beam sweep-to-sweep implant dose and/or wafer-to-wafer implant dose and/or day-to-day implant dose (or, e.g., over longer time intervals such as weeks or months) may be obtained.

Figure 8:
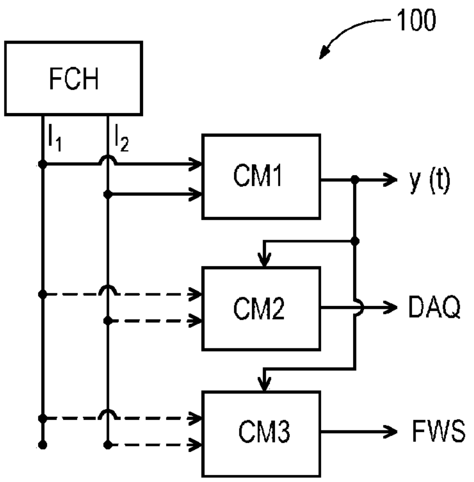
FIG. 8 is a schematic view of an exemplary ion beam current measurement device forming part of a dosimetry system.

FIG. 8 illustrates a schematic view of an exemplary ion beam current measurement device 100. The ion beam current measurement device 100 includes the Faraday cup hardware FCH and a slit width change computation module CM1. The slit width change computation module CM1 may be configured to calculate a time-dependent slit width change indicator y(t) based on the first current signal $I_1$ and the second current signal $I_2$, and, optionally, based on the knowledge about the (initial) slit widths $W_1$, $W_2$. For example, y (t) may be calculated in accordance with equation (2).

The slit width change indicator y(t) allows to monitor Faraday cup slit degradation. The slit width change indicator y (t) can be used for many different purposes. For example, it may merely be used to have more information on the status of the Faraday cup hardware FCH degradation for scheduling appropriate maintenance intervals (e.g. PM intervals). However, as already mentioned, the slit width change indicator y (t) my further be used to correct or recalibrate the dosimetry system in accordance with FIG. 7. Further, it may be used to generate operation fault warnings.

The ion beam current measurement device 100 may further include a dose adjustment computation module CM2 configured to derive a dose adjustment quantity DAQ based on the time-dependent slit width change indicator y(t). In one example, DAQ may be derived based on equation (3) or given by equation (3).

The ion beam current measurement device 100 may further include an operation fault detection module CM3 configured to derive a fault warning signal FWS based on a comparison of a rate of change dy (t)/dt of the time-dependent slit width change indicator y (t) with a predetermined threshold.

Figure 9:
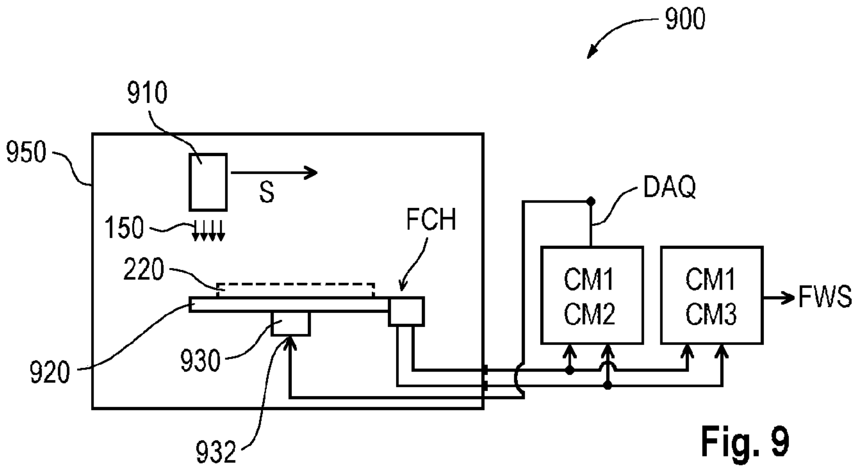
FIG. 9 is a schematic view of an exemplary ion beam implantation system including a dosimetry system.

Referring to FIG. 9, an ion beam implantation system 900 may, e.g., include a process chamber 950. The ion beam implantation system 900 may correspond to ion beam implantation system 200 and the process chamber 950 may correspond to process chamber 210 (FIG. 2). A substrate holder 920 is disposed in the process chamber 950 and configured to hold, during operation, a substrate 220 to be subjected to ion implantation. An ion beam generator 910 is used to generate the ion beam 150 for ion implantation into the substrate 220. An (optional) sweeping direction of the ion beam generator 910 is indicated by arrow S. Further, the ion beam current measurement device, or at least the Faraday cup hardware FCH thereof, is, e.g., contained in the process chamber 950 and disposed adjacent the substrate holder 920. The ion beam implantation system 900 may further include the slit width change computation module CM1 configured to calculate the time-dependent slit width change indicator y(t).

Generally, the implant dose of the ion beam 150 may be controlled based on the time-dependent slit width change indicator y(t). The control may be such that dose adjustment computation module CM2 is configured to derive a dose adjustment quantity DAQ based on y (t). A dosimetry system, which is defined as the system used to control the implant dose (and which can be implemented in various different ways as already described) may include or use the dose adjustment computation module CM2 for implant dose control.

The dose adjustment quantity DAQ can be used to control the implant dose by the dosimetry system. In one example, DAQ may be operatively connected to a control input 932 of a drive 930 of a substrate holder 920. In this case, the speed of movement of the substrate holder 920 in the direction of arrow M may be a function (e.g. of a proportional relationship) of DAQ. Other dosimetry systems may, e.g., use other means for controlling the implant dose than the drive 930.

The dose adjustment computation module CM2 may be implemented in an open loop or closed loop dosimetry control system. In both cases, the dosimetry system may be controlled based on the corrected ion beam measurement result (e.g. $I_1^{corr}(t)$)

rather than based on the actual ion beam current measurement result (e.g. $I_1(t)$). That is, in both cases the dose adjustment quantity DAQ used to control the dosimetry system reflects the "true" dosimetry measurement result (based, e.g., on $I_1^{corr}(t)$)

rather than the "erroneous" dosimetry measurement result (based, e.g., $I_1(t)$) which is distorted by slit degradation. The closed loop control acts to maintain the relative dose constant as shown in the right portion of FIG. 7, i.e. to control the implant dose to be equal to the target implant dose irrespective of slit degradation effects.

Further, the ion beam implantation system 900 may include the operation fault detection module CM3 configured to derive a fault warning signal FWS based on a comparison of a rate of change dy (t)/dt of the time-dependent slit width change indicator y (t) with a predetermined threshold.

Although the increase or narrowing of the first and second ion beam entrance slits 112, 122 are typically identical in absolute values and continuously varying functions in time, there could be a special fault case when material is building up over short time to cause slit narrowing. For example, although at a low probability, there may be the case where a larger "flake" of built-up material can get loose on only one of the two slits 112, 122. This would yield a faulty slit width change indicator y (t) signal.

A method to detect such fault case may comprise deriving a fault warning signal FWS based on a comparison of a rate of change of the time-dependent slit width change indicator y (t) with a predetermined threshold. More specifically, the method may include calculating the change rate of y(t), dy (t)/dt, and defining a threshold for this change rate. Whenever the change rate dy (t)/dt exceeds the set threshold, the operation fault detection module CM3 may output a fault warning signal FWS.

In response to an activation of the fault warning signal FWS, a maintenance procedure may be initiated. The maintenance procedure (e.g. PM) usually includes replacement of the entire Faraday cup hardware FCH or at least the ion beam entrance slits 112, 122.

The following examples pertain to further aspects of the disclosure:

Example 1 is an ion beam current measurement device, comprising: a first Faraday cup having a first ion beam entrance slit of a first width $W_1$, the first Faraday cup is configured to generate a first current signal; and a second Faraday cup having a second ion beam entrance slit of a second width $W_2$, the second Faraday cup is configured to generate a second current signal; wherein $W_2$ is greater than $W_1$.

In Example 2, the subject matter of Example 1 can optionally include wherein a distance between the first ion beam entrance slit and the second ion beam entrance slit is equal to or less than 5 cm, 2 cm, 1 cm, or 0.5 cm.

In Example 3, the subject matter of Example 1 or 2 can optionally include wherein $W_2/W_1$ is equal to or greater than 1.5, 2, 3, 4, or 5.

In Example 4, the subject matter of any preceding Example can optionally further include a Faraday cup frame to which the first ion beam entrance slit and the second ion beam entrance slit are mounted or in which they are formed.

In Example 5, the subject matter of any preceding Example can optionally further include a slit width change computation module configured to calculate a time-dependent slit width change indicator based on the first current signal and the second current signal.

In Example 6, the subject matter of Example 5 can optionally include wherein the calculation of the time-dependent slit width change indicator is based on a ratio of the slit widths $W_1$, $W_2$ and a ratio of the first and second current signals.

In Example 7, the subject matter of Example 5 or 6 can optionally further include a dose adjustment computation module configured to derive a dose adjustment quantity based on the time-dependent slit width change indicator.

In Example 8, the subject matter of any of Examples 5 to 7 can optionally further include an operation fault detection module configured to derive a fault warning signal based on a comparison of a rate of change of the time-dependent slit width change indicator with a predetermined threshold.

Example 9 is an ion beam implantation system, including a process chamber; a substrate holder disposed in the process chamber and configured to hold a substrate to be subjected to ion implantation; an ion beam generator configured to generate an ion beam for ion implantation into the substrate; the ion beam current measurement device of any of Examples 1 to 4, disposed adjacent the substrate holder; a slit width change computation module configured to calculate a time-dependent slit width change indicator based on the first current signal and the second current signal; and an implant dose control system configured to control the implant dose based on the time-dependent slit width change indicator.

In Example 10, the subject matter of Example 9 can optionally include wherein the ion beam generator is configured to sweep the ion beam in a first direction across the substrate, wherein the entrance slits of the first and second Faraday cups are oriented in a second direction substantially perpendicular to the first direction.

In Example 11, the subject matter of Example 9 or 10 can optionally include wherein the ion beam current measurement device is disposed adjacent one side of the substrate holder.

In Example 12, the subject matter of any of Examples 9 to 11 can optionally include wherein the implant dose control system comprises a dose adjustment computation module configured to derive a dose adjustment quantity based on the time-dependent slit width change indicator.

In Example 13, the subject matter of any of Examples 9 to 12 can optionally further include an operation fault detection module configured to derive a fault warning signal based on a comparison of a rate of change of the time-dependent slit width change indicator with a predetermined threshold.

In Example 14, the subject matter of any of Examples 9 to 13 can optionally include wherein the slit width change computation module is configured to repeatedly update the time-dependent slit width change indicator during an operating period.

Example 15 is a method of monitoring a process of ion implantation into a substrate, the method comprising: measuring first and second current signals generated by first and second Faraday cups having first and second ion beam entrance slits of first and second widths $W_1$ and $W_2$, respectively, wherein $W_2$ is greater than $W_1$; and calculating a time-dependent slit width change indicator based on the first current signal and the second current signal.

In Example 16, the subject matter of Example 15 can optionally include wherein the calculation of the time-dependent slit width change indicator is based on a ratio of the slit widths $W_1$, $W_2$ and a ratio of the first and second current signals.

In Example 17, the subject matter of Example 15 or 16 can optionally further include computing a dose adjustment quantity to control the dose of an ion beam used in the process of ion implantation, the dose adjustment quantity being based on the time-dependent slit width change indicator.

In Example 18, the subject matter of Example 17 can optionally include wherein the dose adjustment quantity is repeatedly updated during an operating period, in particular a maintenance interval, of an ion beam implantation system used to perform the process of ion implantation.

In Example 19, the subject matter of any of Examples 15 to 18 can optionally further include deriving a fault warning signal based on a comparison of a rate of change of the time-dependent slit width change indicator with a predetermined threshold.

In Example 20, the subject matter of Example 19 can optionally further include initiating a maintenance procedure in response to an activation of the fault warning signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An ion beam current measurement device, comprising:

a first Faraday cup having a first ion beam entrance slit of a first width $W_1$, the first Faraday cup being configured to generate a first current signal;

a second Faraday cup having a second ion beam entrance slit of a second width $W_2$, the second Faraday cup being configured to generate a second current signal; and a slit width change computation module configured to calculate a time-dependent slit width change indicator based on the first current signal and the second current signal, wherein $W_2$ is greater than $W_1$.

2. The ion beam current measurement device of claim 1, wherein a distance between the first ion beam entrance slit and the second ion beam entrance slit is equal to or less than 5 cm.

3. The ion beam current measurement device of claim 1, wherein $W_2/W_1$ is equal to or greater than 1.5.

4. The ion beam current measurement device of claim 1, further comprising:

a Faraday cup frame to which the first ion beam entrance slit and the second ion beam entrance slit are mounted or in which the first ion beam entrance slit and the second ion beam entrance slit are formed.

5. The ion beam current measurement device of claim 1, wherein the calculation of the time-dependent slit width change indicator is based on a ratio of the slit widths $W_1$, $W_2$ and a ratio of the first and second current signals.

6. The ion beam current measurement device of claim 1, further comprising:

a dose adjustment computation module configured to derive a dose adjustment quantity based on the time-dependent slit width change indicator.

7. The ion beam current measurement device of claim 1, further comprising:

an operation fault detection module configured to derive a fault warning signal based on a comparison of a rate of change of the time-dependent slit width change indicator with a predetermined threshold.

8. An ion beam implantation system, comprising:

a process chamber;

a substrate holder disposed in the process chamber and configured to hold a substrate to be subjected to ion implantation;

an ion beam generator configured to generate an ion beam for ion implantation into the substrate;

the ion beam current measurement device of claim 1, disposed adjacent the substrate holder;

a slit width change computation module configured to calculate a time-dependent slit width change indicator based on the first current signal and the second current signal; and an implant dose control system configured to control an implant dose of the ion beam based on the time-dependent slit width change indicator.

9. The ion beam implantation system of claim 8, wherein the ion beam generator is configured to sweep the ion beam in a first direction across the substrate, and wherein the entrance slits of the first and second Faraday cups are oriented in a second direction substantially perpendicular to the first direction.

10. The ion beam implantation system of claim 8, wherein the ion beam current measurement device is disposed adjacent one side of the substrate holder.

11. The ion beam implantation system of claim 8, wherein the implant dose control system comprises a dose adjustment computation module configured to derive a dose adjustment quantity based on the time-dependent slit width change indicator.

12. The ion beam implantation system of claim 8, further comprising:

an operation fault detection module configured to derive a fault warning signal based on a comparison of a rate of change of the time-dependent slit width change indicator with a predetermined threshold.

13. The ion beam implantation system of claim 8, wherein the slit width change computation module is configured to repeatedly update the time-dependent slit width change indicator during an operating period.

14. The ion beam current measurement device of claim 1, wherein $W_1$ and $W_2$ extend in a same direction.

15. A method of monitoring a process of ion implantation into a substrate, the method comprising:

measuring first and second current signals generated by first and second Faraday cups having first and second ion beam entrance slits of first and second widths $W_1$ and $W_2$, respectively, wherein $W_2$ is greater than $W_1$; and calculating a time-dependent slit width change indicator based on the first current signal and the second current signal.

16. The method of claim 15, wherein the calculation of the time-dependent slit width change indicator is based on a ratio of the slit widths $W_1$, $W_2$ and a ratio of the first and second current signals.

17. The method of claim 15, further comprising:

computing a dose adjustment quantity to control a dose of an ion beam used in the process of ion implantation, the dose adjustment quantity being based on the time-dependent slit width change indicator.

18. The method of claim 17, wherein the dose adjustment quantity is repeatedly updated during a maintenance interval of an ion beam implantation system used to perform the process of ion implantation.

19. The method of claim 15, further comprising:

deriving a fault warning signal based on a comparison of a rate of change of the time-dependent slit width change indicator with a predetermined threshold.

20. The method of claim 19, further comprising:

initiating a maintenance procedure in response to an activation of the fault warning signal.

* * * * *